(12) United States Patent
Atoji et al.

(10) Patent No.: US 7,642,112 B2
(45) Date of Patent: Jan. 5, 2010

(54) METHOD OF MANUFACTURING BONDED SUBSTRATE STACK

(75) Inventors: Tadashi Atoji, Yokohama (JP); Ryuji Moriwaki, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 11/222,903

(22) Filed: Sep. 9, 2005

(65) Prior Publication Data

US 2006/0073644 A1    Apr. 6, 2006

(30) Foreign Application Priority Data

Sep. 9, 2004 (JP) .............................. 2004-262966

(51) Int. Cl.
*H01L 21/00* (2006.01)
(52) U.S. Cl. .................................. 438/33; 257/E21.563
(58) Field of Classification Search .................. 438/33, 438/147, 479, 458, 156, 60; 257/E21.211, 257/E21.568, E21.122
See application file for complete search history.

(56) References Cited

U.S. PATENT DOCUMENTS

| | | | |
|---|---|---|---|
| 5,362,667 A * | 11/1994 | Linn et al. ................... 438/455 |
| 5,374,564 A | 12/1994 | Bruel ........................... 437/24 |
| 5,448,126 A * | 9/1995 | Eda et al. .................. 310/313 A |
| 5,451,547 A * | 9/1995 | Himi et al. ................. 438/455 |
| 5,453,652 A * | 9/1995 | Eda et al. ................. 310/313 R |
| 5,785,874 A * | 7/1998 | Eda ............................ 216/24 |
| 5,932,048 A * | 8/1999 | Furukawa et al. ........... 156/153 |
| 6,018,211 A * | 1/2000 | Kanaboshi et al. ...... 310/313 R |
| 6,054,190 A * | 4/2000 | Ogawa et al. ............. 427/510 |
| 6,156,624 A | 12/2000 | Yamagata et al. ........... 438/459 |
| 6,465,809 B1 * | 10/2002 | Furukawa et al. ............. 257/94 |
| 6,815,141 B2 * | 11/2004 | Fujita et al. ................. 430/200 |
| 6,852,652 B1 * | 2/2005 | Maa et al. .................... 438/197 |
| 6,881,644 B2 * | 4/2005 | Malik et al. ................. 438/409 |
| 2003/0148630 A1 * | 8/2003 | Hu ............................. 438/781 |
| 2003/0211705 A1 * | 11/2003 | Tong et al. .................. 438/455 |
| 2004/0035525 A1 * | 2/2004 | Yokokawa et al. .......... 156/281 |
| 2004/0105990 A1 * | 6/2004 | Shiobara et al. .......... 428/473.5 |

(Continued)

FOREIGN PATENT DOCUMENTS

EP      1 381 086 A1    1/2001

(Continued)

OTHER PUBLICATIONS

VLSI Fabrication Principles, Sorab K. Ghandhi.*

*Primary Examiner*—Fernando L Toledo
*Assistant Examiner*—Ankush k Singal
(74) *Attorney, Agent, or Firm*—Canon U.S.A., Inc., IP Division

(57) ABSTRACT

A method of manufacturing a bonded substrate stack includes a bonding surface processing step of processing at least one of first and second substrates each containing silicon and having a bonding surface, and a bonding step of bonding the bonding surface of the first substrate and the bonding surface of the second substrate. The bonding surface processing step includes an OH group increasing step of increasing OH groups on the bonding surfaces, and a moisture content decreasing step of heating the bonding surfaces where the OH groups have been increased at a temperature falling within a range of 50° C. to 200° C. to decrease moisture contents of the bonding surfaces.

12 Claims, 7 Drawing Sheets

U.S. PATENT DOCUMENTS

2005/0079712 A1* 4/2005 Tong et al. .................. 438/689

FOREIGN PATENT DOCUMENTS

| JP | 03-294934 | 12/1991 |
| --- | --- | --- |
| JP | 5-021338 | 1/1993 |
| JP | 05-021338 | 1/1993 |
| JP | 05-211128 | 8/1993 |
| JP | 5-0211128 | 8/1993 |
| JP | 07-249749 | 9/1995 |
| JP | 7-249749 | 9/1995 |
| JP | 9-331049 | 12/1997 |
| JP | 3294934 | 4/2002 |
| JP | 2002-313689 | 10/2002 |
| JP | 2003-309101 | 10/2003 |

* cited by examiner

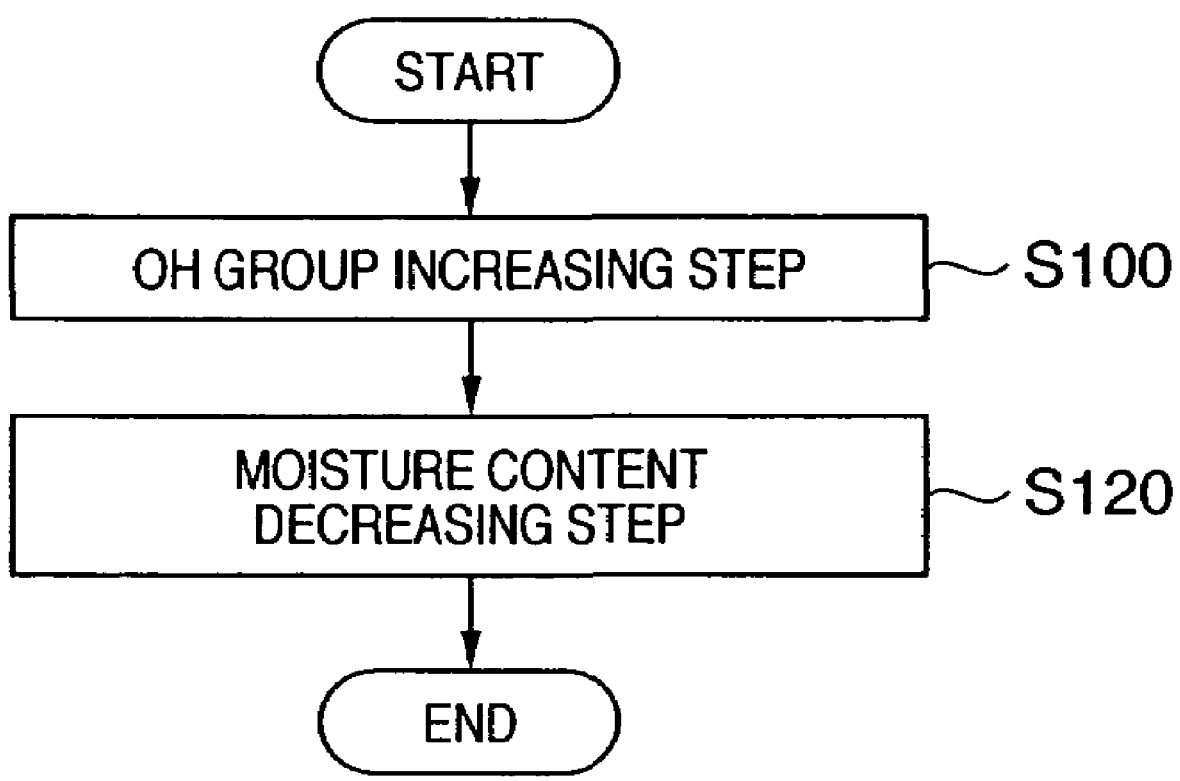

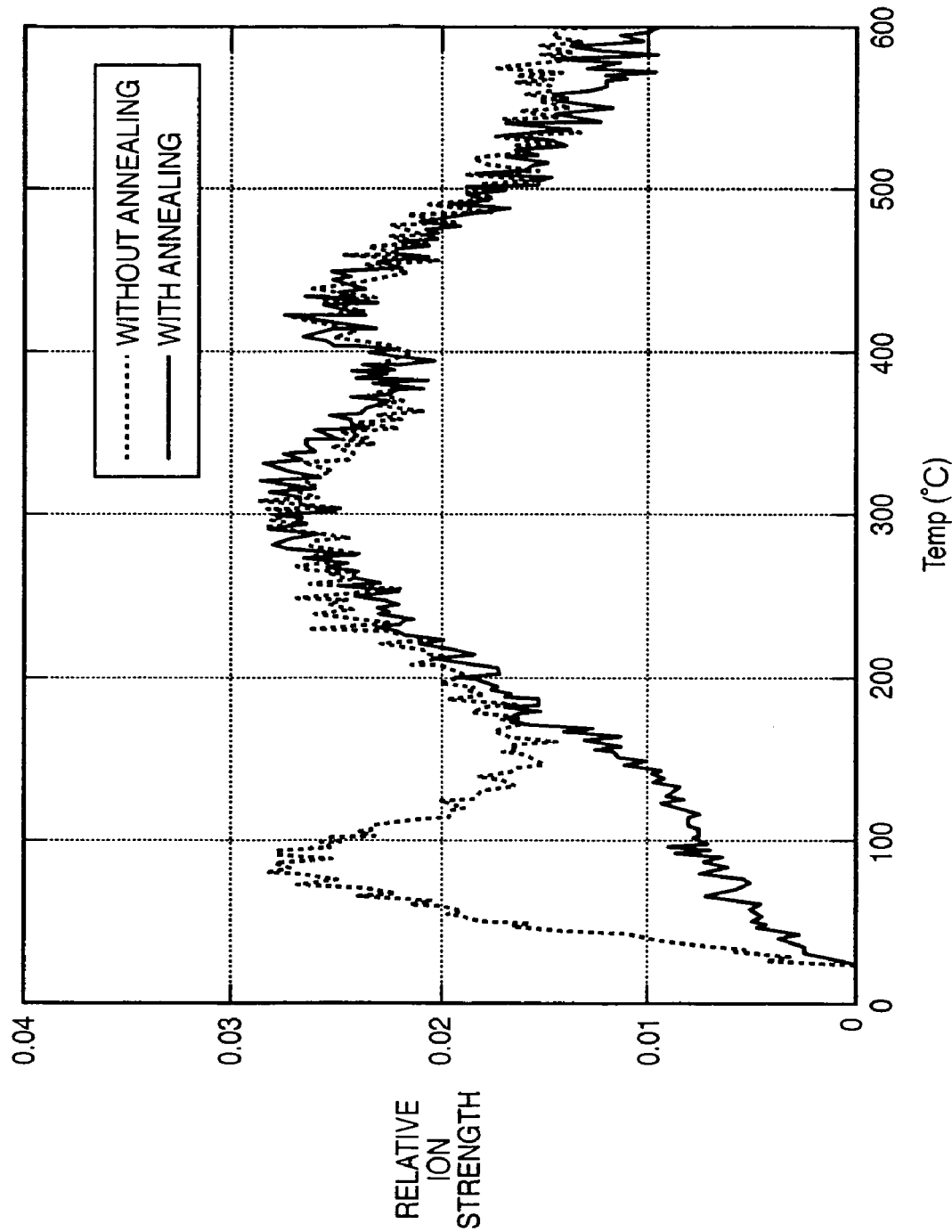

FIG. 4B

| | PHYSICALLY ADSORBED MOISTURE CONTENT (200°C) | Si-OH (200~400°C) |
|---|---|---|
| WITHOUT ANNEALING | 3.30E+13 atoms/cm² | 1.32E+14 atoms/cm² |
| WITH ANNEALING | 1.12E+13 atoms/cm² | 1.32E+14 atoms/cm² |

METHOD OF MANUFACTURING BONDED SUBSTRATE STACK

FIELD OF THE INVENTION

The present invention relates to a method of manufacturing a bonded substrate stack by bonding two substrates.

BACKGROUND OF THE INVENTION

In recent years, as the performance of electronic devices improves and portable electronic devices become popular, an SOI (Silicon On Insulator) wafer adsorbs attention which can operate at a higher speed with lower power consumption than a bulk wafer.

Methods of manufacturing SOI wafers are roughly classified into an SIMOX method and bonding method. The bonding method is superior to the SIMOX method in that it can use a high-quality silicon thermal oxide film as a buried insulating layer. According to the bonding method, typically, a thermal oxide film is formed on the surface of one or each of two silicon wafers by the thermal oxidation method, and thereafter the two silicon wafers are bonded. Then, the bonding strength of the wafers is increased by annealing. Furthermore, unnecessary portions are removed to leave an SOI layer having a desired thickness. The bonding method can control the thicknesses of the SOI layer and buried insulating layer freely.

A typical example of the bonding method includes a method described in Japanese Patent Laid-Open No. 5-21338 (this method is known as the ELTRAN (registered trademark) method) and a method described in Japanese Patent Laid-Open No. 5-211128 (this method is known as the Smart Cut (registered trademark) method).

As the bonding method includes a step of bonding two wafers, as described above, defects such as voids should not be caused in the bonding interface. Various types of approaches have been made to decrease the defects in the bonding interface.

Japanese Patent Laid-Open No. 2002-313689 discloses a method of bonding two substrates as bonding targets while leaving moisture contents on the two substrates to decrease void defects or blister defects. According to the prior art introduced in Japanese Patent Laid-Open No. 2002-313689, the two substrates as the bonding targets are cleaned, and before they are bonded, they are dried by IPA steam dry.

Japanese Patent Laid-Open No. 2003-309101 discloses a method of SC-1-cleaning two substrates and thereafter bonding them.

Japanese Patent No. 3294934 discloses a method of activating, before bonding two substrates, the surface of one substrate by a plasma process and thereafter adsorbing water with the activated surface.

Japanese Patent Laid-Open No. 9-331049 discloses a method of rendering, before bonding two substrates, the surface of one substrate hydrophobic.

In bonding the two substrates, a high bonding strength is obtained if the bonding step is performed after the bonding surfaces are rendered hydrophilic. As discussed in Japanese Patent Laid-Open No. 9-331049, however, if the bonding surfaces are rendered hydrophilic, due to excessive moisture contents adsorbed by the bonding surfaces, voids tend to be easily formed in the peripheral portions of the bonding surfaces. In view of this, Japanese Patent Laid-Open No. 9-331049 proposes an approach in which a bonding step is performed after the bonding surfaces are rendered hydrophobic and thereafter the lack in bonding strength is compensated for by a later annealing step.

In other words, conventionally, when the bonding surfaces are imparted with hydrophily, voids tend to be formed in the peripheral portion of the bonding interface. When the bonding surfaces are imparted with hydrophoby, the bonding strength tends to decrease.

SUMMARY OF THE INVENTION

The present invention has been made based on the recognition of the above problems, and has as its object to decrease occurrence of defects such as voids and increase the bonding strength in the manufacture of a bonded substrate stack.

According to the present invention, there is provided a method of manufacturing a bonded substrate stack comprising a bonding surface processing step of processing at least one of first and second substrates each containing silicon and having a bonding surface, and a bonding step of bonding the bonding surface of the first substrate and the bonding surface of the second substrate. The bonding surface processing step includes an OH group increasing step of increasing OH groups on the bonding surface, and a moisture content decreasing step of heating the bonding surface where the OH groups have been increased at a temperature falling within a range of 50° C. to 200° C. to decrease moisture content of the bonding surface.

According to a preferred embodiment of the present invention, in the moisture content decreasing step, preferably, the bonding surface where the OH groups have been increased is heated at a temperature falling within a range of 60° C. to 175° C.

According to another preferred embodiment of the present invention, preferably, the moisture content decreasing step is performed in one of an atmosphere, inert gas atmosphere, and reduced pressure atmosphere.

According to still another preferred embodiment of the present invention, preferably, the bonding surface processing step is performed such that the OH groups in the bonding surface become not less than $5\times10^{13}$ (atoms/cm$^2$) and that the moisture content in the bonding surface becomes not more than $5\times10^{13}$ (atoms/cm$^2$).

According to still another preferred embodiment of the present invention, preferably, for example, the OH group increasing step includes a step of cleaning the bonding surface with a cleaning liquid that increases the OH groups.

According to still another preferred embodiment of the present invention, preferably, for example, the OH group increasing step includes a step of activating the bonding surface and thereafter providing water to the bonding surface. For example, the OH group increasing step can include a step of irradiating the bonding surface with light or a plasma to activate the bonding surface.

According to still another preferred embodiment of the present invention, preferably, the bonding step is performed such that a bonding portion of the first and second substrates enlarges with a speed of not more than 10 mm/sec.

According to still another preferred embodiment of the present invention, for example, a substrate having a silicon layer and silicon oxide layer sequentially on a separation layer can be employed as the first substrate, and a silicon substrate can be employed as the second substrate.

According to still another preferred embodiment of the present invention, a substrate having a silicon layer and silicon oxide layer sequentially on a separation layer can be employed as the first substrate, and a substrate having a silicon oxide layer on a surface thereof can be employed as the second substrate.

According to still another preferred embodiment of the present invention, a substrate having a silicon layer on a surface thereof and a separation layer thereunder can be employed as the first substrate, and a substrate having a silicon oxide layer on a surface thereof can be employed as the second substrate.

According to still another preferred embodiment of the present invention, the manufacturing method can further comprise, after the bonding step, a step of dividing the bonded substrate stack by using the separation layer.

According to the present invention, in the manufacture of a bonded substrate stack, occurrence of defects such as voids can be decreased, and the bonding strength can be increased.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a flowchart showing the procedure of a bonding surface processing step which can be performed prior to bonding two substrates;

FIGS. 4A and 4B are a graph and table, respectively, showing the evaluation result of a difference in moisture content depending on heating according to APIMS-TDS;

DETAILED DESCRIPTION OF THE PREFERRED EMBODIMENTS

Figure 1A:
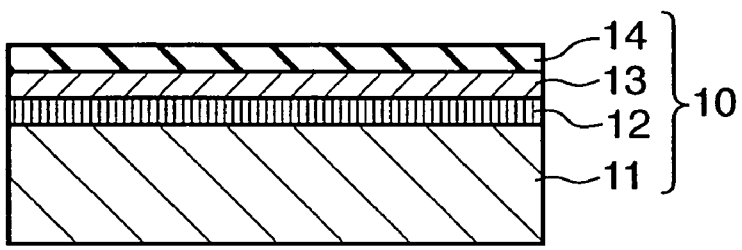
FIGS. 1A to 1D are views showing a method of manufacturing an SOI substrate.

The preferred embodiments of the present invention will be described with reference to the accompanying drawings.

Substrates each having a surface containing silicon can be bonded by means of moisture contents physically adsorbed by the bonding surfaces and OH groups which terminate the bonding surfaces of the respective substrates. Bonding by means of moisture contents can cause defects such as voids. This is described in Japanese Patent Laid-Open No. 9-331049 in detail. The present invention is aimed at increasing the OH groups which increase the bonding strength as well as decreasing the moisture contents that cause defects. More specifically, according to the present invention, in bonding (adhering) two substrates each having a surface containing silicon, a bonding surface processing step is performed which includes an OH group increasing step of increasing OH groups in the surface (bonding surface) of at least one substrate and a moisture content decreasing step of heating the substrate where OH groups have been increased to decrease the moisture content in the surface (bonding surface) of the substrate. The bonding surface processing step can decrease the moisture content that causes defects while forming OH groups sufficient to increase the bonding strength of the two substrates in the bonding surfaces. In other words, the OH group increasing step and moisture content decreasing step can control both the number of OH groups and moisture content in the surface (bonding surface) of the substrate.

The OH group increasing step can include a cleaning step of rendering hydrophilic the substrate surface, e.g., SC-1 or SC-2, by increasing the OH groups. Alternatively, the OH group increasing step can include an activating step and a subsequent pure-water cleaning step. The activating step can include a step of irradiating the substrate with, e.g., light or a plasma.

The substrate heating temperature in the moisture content decreasing step preferably falls within the range of 50° C. to 200° C. and more preferably 60° C. to 175° C.

If the substrate is heated to a temperature exceeding 200° C., the OH groups increased in the OH group increasing step desorb from the substrate surface to decrease the expected bonding strength obtained when the two substrates are bonded. Hence, the substrate is preferably heated at a temperature of 200° C. or less. To sufficiently prevent desorption of the OH groups, more preferably, the substrate is heated at a temperature of 175° C. or less. Even when the substrate is heated at a temperature less than 50° C., the moisture content in the substrate surface cannot be sufficiently decreased within a short period of time. Hence, the substrate is preferably heated at a temperature of 50° C. or more. To further decrease the moisture content that can cause defects in the bonding surface, the substrate is more preferably heated at a temperature of 100° C. or more.

The moisture content decreasing step is preferably performed in, e.g., an atmosphere, inert gas atmosphere, or reduced pressure atmosphere.

The bonding surface processing step is preferably performed such that the OH groups in the bonding surface becomes $5 \times 10^{13}$ (atoms/cm$^2$) or more and that the moisture content in the bonding surface becomes $5 \times 10^{13}$ (atoms/cm$^2$) or more.

The moisture content can be adjusted by measuring and evaluating the moisture content by APIMS-TDS or the like and appropriately adjusting the formulation, time, and the like of the processing steps such that the OH groups and moisture content in the bonding surface reach predetermined amounts.

According to this bonding surface processing step, in the manufacture of the bonded substrate stack, occurrence of defects such as voids can be decreased, and the bonding strength can be increased. Occurrence of the defects such as voids directly influences the improvement of the yield. Furthermore, an improvement in bonding strength decreases separation of the SOI layer in the device steps to contribute to the improvement in yield.

[SOI Substrate Manufacturing Method]

An SOI substrate manufacturing method which can be provided by the present invention will be described with reference to FIGS. 1A to 1D.

First, in the step shown in FIG. 1A, a silicon substrate 11 to serve as a seed substrate or bonding substrate is prepared. The silicon substrate 11 is processed to fabricate a first substrate 10 which sequentially has a separation layer 12, silicon layer 13, and silicon oxide layer (SiO$_2$) 14 serving as an insulating layer on the silicon substrate 11. This method mainly comprises two methods.

According to the first method, a porous layer serving as the separation layer 12 is formed on the surface of the silicon substrate 11 by anodizing or the like. Subsequently, the silicon layer 13 is formed on the separation layer 12 by epitaxial growth. Then, the silicon oxide layer 14 is formed on the silicon layer 13 by the thermal oxidation method or the like.

According to the second method, the silicon oxide layer 14 is formed on the surface of the silicon substrate 11 by the thermal oxidation method or the like. Subsequently, ions such as hydrogen ions are implanted to a predetermined depth in the silicon substrate 11 through the silicon oxide layer 14 to form a defective layer (ion implanted layer) serving as the separation layer 12. With this step, the silicon layer 13 is left between the separation layer 12 and silicon oxide layer 14.

Figure 1B:
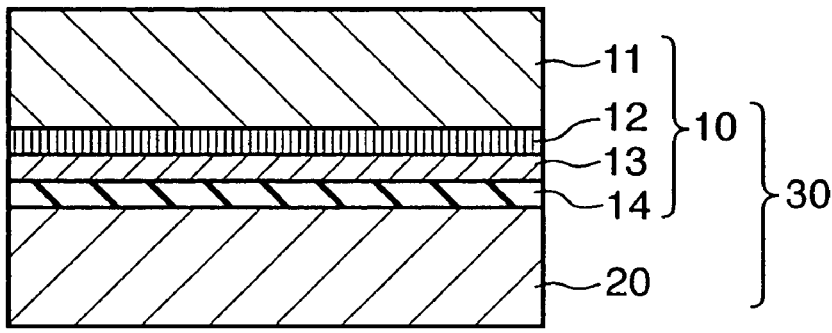

In the step shown in FIG. 1B, a silicon substrate serving as a second substrate 20 is bonded to the surface side (oxide silicon layer side) of the first substrate 10 to fabricate a bonded substrate stack 30. Prior to this bonding step, a bonding surface processing step including an OH group increasing step and moisture content decreasing step is performed.

In place of providing the silicon oxide layer 14 to the first substrate 10, a silicon oxide layer may be provided to the surface of the second substrate 20, or silicon oxide layers may be provided to the surfaces of both the first and second substrates 10 and 20. Such a silicon oxide layer forms a buried insulating layer after bonding the two substrates.

Figure 1C:
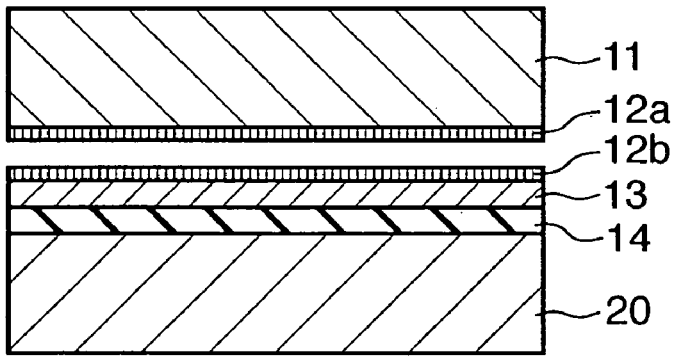

In the step shown in FIG. 1C, the bonded substrate stack 30 is divided by using the separation layer 12 to obtain a substrate having the thin silicon layer 13 on the silicon oxide layer 14 serving as the buried insulating layer. Formation of the separation layer 12 is not always necessary. If no separation layer 12 is to be formed, in the step shown in FIG. 1C, part of the silicon substrate 11 may be removed from the bonded substrate stack 30 by grinding or the like to leave the silicon layer 13 having a desired thickness of the silicon oxide layer 14.

Figure 1D:
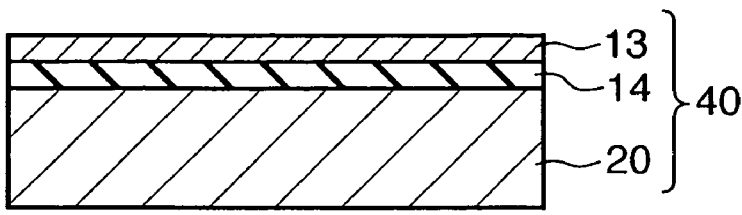

In the step shown in FIG. 1D, a separation layer 12b remaining on the surface of the silicon layer 13 is removed by etching or the like, and after that the surface of the silicon layer 13 is planarized when necessary. For example, this planarization can be performed by annealing the silicon layer 13 in a hydrogen atmosphere. With the above steps, an SOI substrate 40 having the silicon layer (SOI layer) 13 on the silicon oxide layer 14 serving as the buried insulating layer can be obtained.

After division of the silicon substrate 11, a separation layer 12a remaining on the surface of the silicon substrate 11 may be removed and the resultant surface may be planarized when necessary, so that the silicon substrate 11 can be reused as the material of the first substrate 10 or as the second substrate 20.

Preferred embodiments of the bonding surface processing step which can be applied to the SOI substrate manufacturing method described above will be described.

First Embodiment

A first substrate 10 and second substrate 20 as the bonding targets are both substrates each having a surface containing silicon. The first substrate 10 can have a silicon oxide layer 14 on its surface, as shown in FIG. 1A, but alternatively a silicon layer 13 may be formed on its surface, as described above. The surface of the second substrate 20 can be formed of silicon, as shown in FIG. 1B, but alternatively the surface of the second substrate 20 may be formed of silicon oxide, as descried above.

FIG. 2 is a flowchart showing the procedure of the bonding surface processing step that can be performed prior to the bonding of the first and second substrates 10 and 20. The bonding surface processing step includes OH group increasing step S100 and moisture content decreasing step S120 which is to be performed subsequent to step S100.

The bonding surface processing step is performed for at least one of the first and second substrates 10 and 20, and preferably for the both substrates.

According to this embodiment, in OH group increasing step S100, SC-1 or SC-2 cleaning which renders hydrophilic the substrate surface containing silicon is performed for the surface (bonding surface) of one or both of the first and second substrates 10 and 20. This increases the OH groups in the substrate surface. When the OH groups increase, the expected bonding strength obtained when the first and second substrates 10 and 20 are bonded increases.

OH group increasing step S100 is not hindered from partly including a hydrophobic cleaning step which uses an HF-based cleaning liquid (a cleaning liquid which renders the substrate surface hydrophobic) such as FPM or DHF. If the substrate has a surface made of silicon alone, such a hydrophobic cleaning step should not be performed at least in the final stage of the OH group increasing step.

In moisture content decreasing step S120, the first substrate 10 and/or second substrate 20 to which OH group increasing step S100 has been performed is heated to evaporate the moisture content on the surface. This decreases the moisture content adsorbed by the surface of the first substrate 10 and/or second substrate 20.

The substrate heating temperature in moisture content decreasing step S120 preferably falls within the range of 50° C. to 200° C. and more preferably 60° C. to 175° C.

If the substrate is heated to a temperature exceeding 200° C., the OH groups increased in OH group increasing step S100 desorb from the substrate 10 and/or 20 to decrease the expected bonding strength obtained when the two substrates 10 and 20 are bonded. Hence, the substrate 10 and/or 20 is preferably heated at a temperature of 200° C. or less. To sufficiently prevent desorption of the OH groups, more preferably, the substrate 10 and/or 20 is heated at a temperature of 175° C. or less. Even when the substrate 10 and/or 20 is heated at a temperature less than 50° C., the moisture content in the substrate surface cannot be sufficiently decreased. Hence, the substrate 10 and/or 20 is preferably heated at a temperature of 50° C. or more, and more preferably superheated at a temperature of 100° C. or more.

In this manner, according to this embodiment, the moisture content which can cause defects can be decreased by moisture content decreasing step S120 while the OH groups sufficient to increase the bonding strength of the first and second substrates 10 and 20 are formed on the surface (bonding surface) by OH group increasing step S100. Thus, the bonding strength of the first and second substrates 10 and 20 can be increased while preventing occurrence of defects such as voids.

Second Embodiment

In the second embodiment, OH group increasing step S100 in the first embodiment is changed. In the second embodiment as well, a bonding surface processing step is performed for at least one of first and second substrates 10 and 20, and preferably for both substrates.

In OH group increasing step S100 of the second embodiment, the surface (bonding surface) of a first substrate 10 and/or second substrate 20 is activated by irradiation with light or a plasma. After that, the activated surface is cleaned with pure water to render it hydrophilic. Usually, activation by means of light irradiation or plasma irradiation can increase OH groups in the substrate surface more than a cleaning method which provides hydrophily. In light irradiation, UV light (ultraviolet light) having a wavelength of 350 nm or more is preferably employed because it has a large energy and can be easily absorbed by the substrate surface. Light irradiation is preferably performed in, e.g., an atmosphere, rare gas, inert gas, or ozone gas. Furthermore, when light irradiation is performed in a reduced pressure atmosphere, OH groups on the substrate surface can be further increased.

In plasma irradiation, for example, a molecule including at least one type of element selected from hydrogen, carbon, nitrogen, and oxygen can be selected. Alternatively, oxygen gas, nitrogen gas, or water vapor ($H_2O$) containing OH groups is also preferable.

It is known that bonding of $SiO_2$ surfaces provides a low strength. When the substrate surface is made hydrophilic by light or plasma irradiation, larger OH groups can be obtained than with the cleaning method which uses a chemical liquid to provide hydrophily. Hence, the second embodiment is particularly useful when both the first and second substrates 10 and 20 have $SiO_2$ layers on their surfaces.

Examples of the present invention will be described.

EXAMPLE 1

Example 1 is directed to an SOI substrate manufacturing method employing the ELTRAN (registered trademark) method. The SOI substrate manufacturing method according to Example 1 will be described with reference to FIGS. 3A to 3G.

Figure 3A:
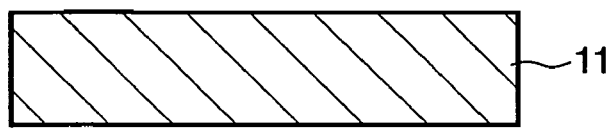
FIGS. 3A to 3G are views showing a method of manufacturing an SOI substrate according to the ELTRAN (registered trademark) method.
Figure 3B:
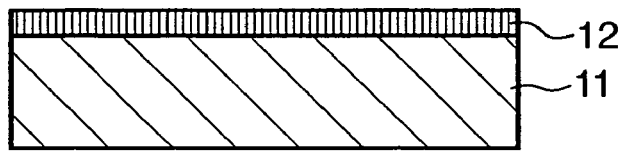
Figure 3C:
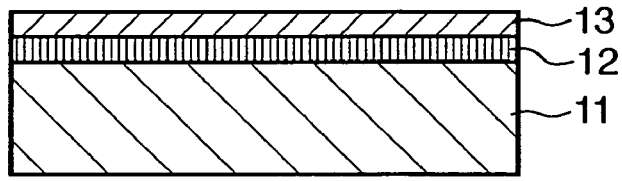
Figure 3D:
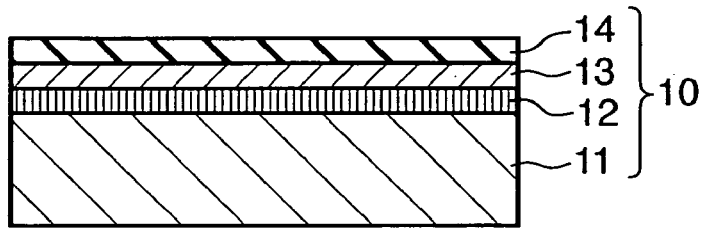

First, in the step shown in FIG. 3A, a silicon substrate 11 to serve as a seed substrate was prepared. In the step shown in FIG. 3B, a porous silicon layer 12 was formed on the surface of the silicon substrate 11 by anodizing. In the step shown in FIG. 3C, a silicon layer 13 which was to be transferred to a second substrate 20 as an SOI layer was epitaxially grown on the porous silicon layer 12 by CVD or the like. In the step shown in FIG. 3D, a silicon oxide layer ($SiO_2$ layer) 14 to serve as a buried oxide film (BOX) layer was formed, thus obtaining a first substrate 10.

Subsequently, in the step shown in FIG. 3E, the surface (bonding surface) of the first substrate 10 and the surface (bonding surface) of the second substrate (silicon substrate) 20 to serve as a handle substrate were subjected to a bonding surface processing step. After that, the first and second substrates 10 and 20 were bonded to obtain a bonded substrate stack 30. The bonding surface processing step was performed in the following manner.

First, the first and second substrates 10 and 20 were cleaned by repeating ozone cleaning and DHF cleaning using a single-wafer cleaning machine, and then rinsed with pure water. In this stage, the second substrate 20 having a silicon surface is hydrophobic.

Subsequently, the surfaces of the first and second substrates 10 and 20 were activated by subjecting them to a nitrogen plasma process. The nitrogen plasma process was performed with discharging power of 200 W for 30 sec by a parallel-plate RF plasma processing apparatus while introducing nitrogen gas at 50 sccm. After the plasma process, the surfaces were rinsed with pure water. Due to the plasma process, the surfaces of the first and second substrates 10 and 20 are terminated with sufficient amounts of OH groups. Meanwhile, excessive moisture contents have been adsorbed by the surfaces of the first and second substrates 10 and 20.

FIGS. 4A and 4B are a graph and table, respectively, showing the evaluation result of moisture contents according to APIMS-TDS of the Si surface (non-annealed) of the second substrate 20 after the activating process and the second substrate 20 (annealed) which has been annealed at 175° C. for 30 sec on the stage of a bonding device (a device which bonds the first and second substrates 10 and 20) after cleaning.

As is apparent from the thermal desorption profile of the "non-annealed" substrate surface, the moisture content (physically adsorbed water) which is adsorbed to the substrate surface with the van der Waals force starts desorption near room temperature of 100° C. or less. The moisture contents which are hydrogen-bonded to Si—OH or Si—O—Si and have peaks near 100° C. mostly complete desorption by a temperature of 200° C.

The voids (non-adhered regions) occur in the peripheral portion of the bonded substrate stack 30 probably because of the adsorbed moisture contents. Furthermore, the OH groups which contribute to the bonding strength start desorption with a peak near 300° C.

As shown in FIGS. 4A and 4B, when annealing was not performed after the activating process, an adsorbed moisture content of $3.30 \times 10^{13}$ (atoms/$cm^2$) was observed, whereas when annealing was performed at 175° C., the peak of the adsorbed moisture content substantially disappeared and a moisture content of $1.12 \times 10^{13}$ (atoms/$cm^2$) was observed. The peak of the OH groups had nothing to do with annealing and was $1.32 \times 10^{14}$ (atoms/$cm^2$). In fine, when annealing is performed at 175° C., only the moisture content which causes defects such as voids can be removed while maintaining the OH groups which contribute to the bonding strength.

Consequently, it was confirmed that the moisture content which caused defects such as voids and the OH groups which contributed to the bonding strength could be separated completely by the desorption temperature (annealing temperature) and controlled independently of each other.

Figure 5A:
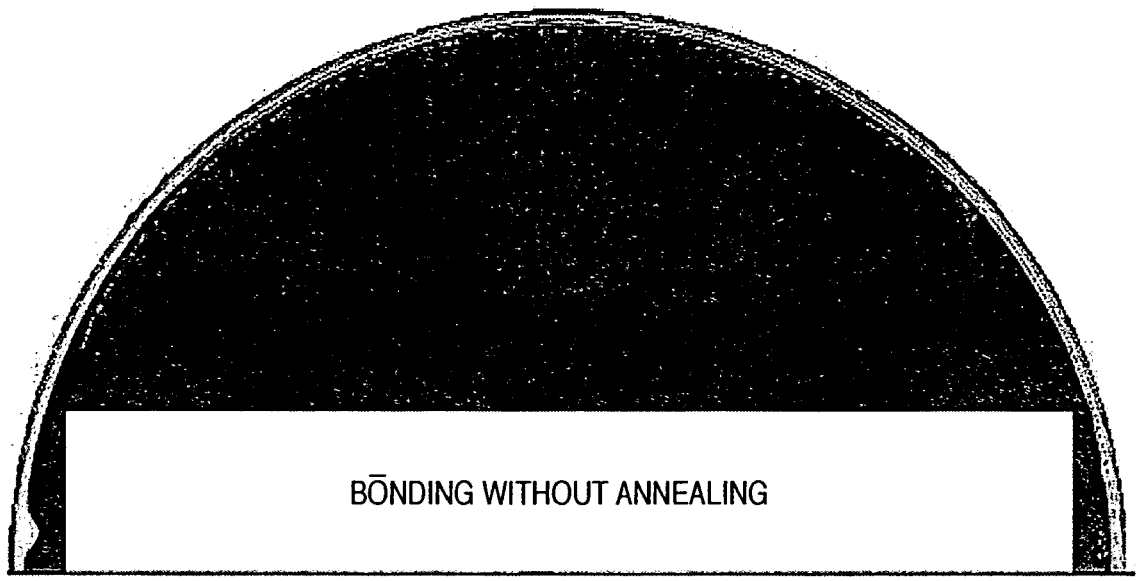
FIG. 5A shows the result of acoustic microscopic observation of a bonded substrate stack obtained by bonding first and second substrates without annealing.
Figure 5B:
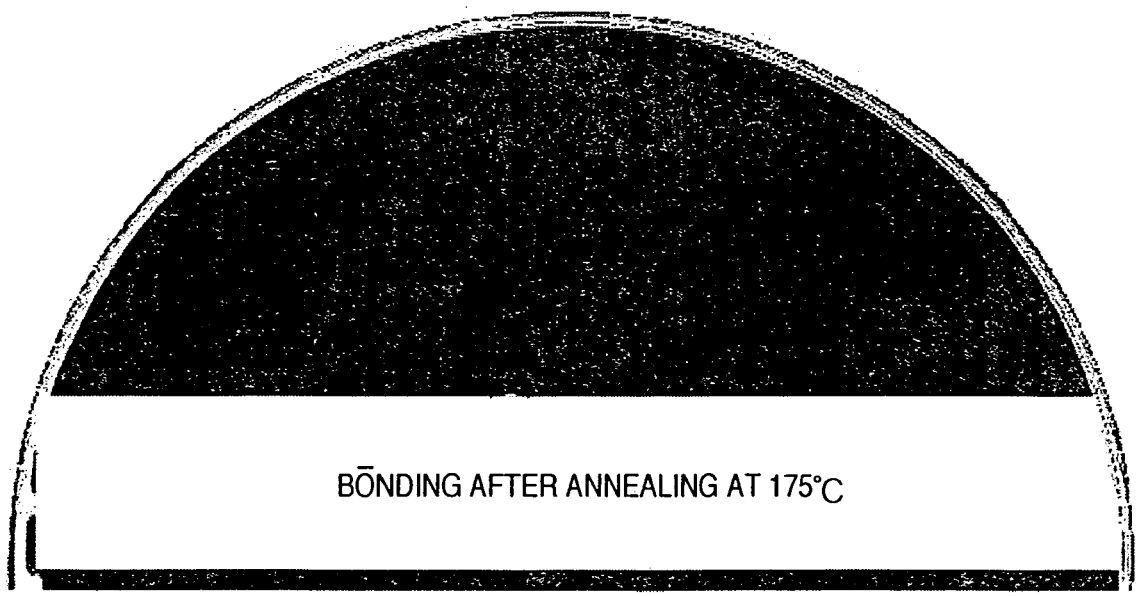
FIG. 5B shows the result of acoustic microscopic observation of a bonded substrate stack obtained by annealing and bonding first and second substrates.

FIG. 5A shows the result of acoustic microscopic observation of a bonded substrate stack obtained by bonding first and second substrates without annealing, and FIG. 5B shows the result of acoustic microscopic observation of a bonded substrate stack obtained by annealing and bonding first and second substrates. Many voids are present in the peripheral portion of the bonded substrate stack which was bonded without annealing, whereas no voids are present in the bonded substrate stack which was bonded after annealing at 175° C.

The first and second substrates 10 and 20 were bonded and thereafter the resultant bonded substrate stack 30 was annealed at a temperature of about 1,000° C. to further increase the bonding strength.

Figure 3E:
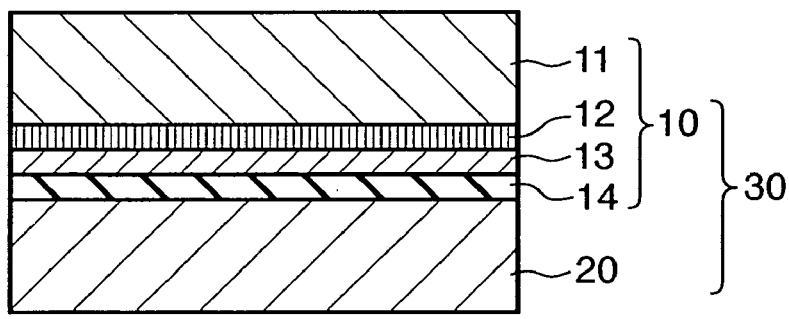
Figure 3F:
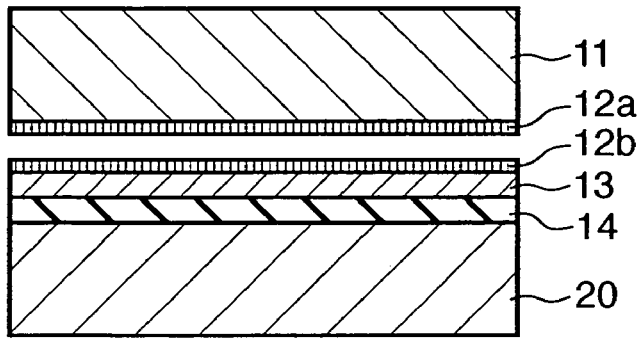

Subsequent to the step shown in FIG. 3E, in the step shown in FIG. 3F, the bonded substrate stack 30 was divided by using the porous silicon layer 12, thus obtaining a substrate having a thin silicon layer 13 on the silicon oxide layer 14 serving as a buried insulating layer.

Figure 3G:
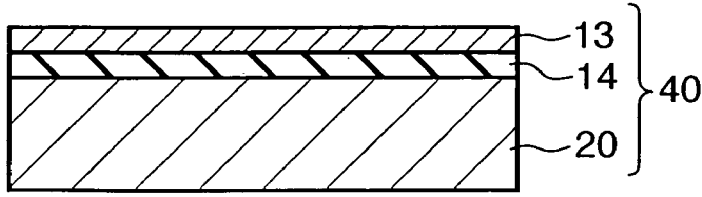

In the step shown in FIG. 3G, a separation layer 12b remaining on the surface of the silicon layer 13 was removed by etching or the like, and the resultant structure was annealed in hydrogen to planarize the surface of the silicon layer 13.

With the above steps, an SOI substrate 40 was obtained which has the silicon layer 13 on the silicon oxide layer 14 serving as the buried insulating layer. The SOI substrate 40 obtained in this manner has no defects such as voids in the bonding interface and provides a sufficiently high bonding strength of the silicon oxide layer 14 and second substrate 20.

As a comparative example, a substrate which had not been subjected to an activating process was evaluated. The adsorbed moisture content was as very small as $5.02 \times 10^{12}$ (atoms/cm$^2$), and the OH groups were also as few as $4 \times 10^{13}$ (atoms/cm$^2$). A bonded substrate stack was fabricated by using this substrate and observed by an acoustic microscope. Although no voids were observed, the bonding strength was low.

EXAMPLE 2

Example 2 is also directed to an SOI substrate manufacturing method employing the ELTRAN method.

In Example 1, the surface of the second substrate serving as the handle substrate was made of silicon. In Example 2, as the second substrate, a silicon substrate having a silicon oxide layer (SiO$_2$ layer) on its surface was used. Accordingly, in Example 2, in bonding the first and second substrates, silicon oxide layers are bonded.

First, a porous silicon layer was formed by anodizing on the surface of a silicon substrate serving as a seed substrate. Subsequently, a silicon layer was epitaxially grown on the porous silicon layer by CVD or the like, and a silicon oxide layer (SiO$_2$ layer) was formed on the epitaxially grown silicon layer, thus obtaining the first substrate. As the second substrate (handle substrate), a silicon substrate having a silicon oxide layer formed on its surface by oxidation or the like was prepared.

The first and second substrates were subjected to a bonding surface processing step. After that, the first and second substrates were bonded to obtain a bonded substrate stack. In this case, the bonding surface processing step was performed in the following manner.

First, the first and second substrates were cleaned by repeating ozone cleaning and DHF cleaning using a single-wafer cleaning machine and then rinsed with pure water. As the first and second substrates had SiO$_2$ layers on their surfaces, they had hydrophilic surfaces with comparatively small moisture contents.

The bonding strength of the SiO$_2$ surfaces was lower than the bonding strength of an Si surface and SiO$_2$ surface. Accordingly, to increase the OH groups more than in Example 1, the two substrate surfaces were activated by subjecting them to an H$_2$O plasma process. The H$_2$O plasma process was performed with discharging power of 300 W for 30 sec by a parallel-plate RF plasma processing apparatus while introducing H$_2$O gas at 100 sccm. After the plasma process, the surfaces were rinsed with pure water.

The surfaces of the first and second substrates are terminated with sufficient amounts of OH groups. Meanwhile, the excessive moisture contents have been adsorbed by the surfaces of the first and second substrates. In this state, when the OH group densities of the first and second substrates were measured by APIMS-TDS measurement, they were $5.20 \times 10^{14}$ (atoms/cm$^2$). This value was larger than $1.32 \times 10^{14}$ (atoms/cm$^2$) of Example 1 by three times or more.

The first and second substrates after the activating process were annealed at 180° C. for 40 sec on the stage of a bonding device and then bonded. This annealing decreased the adsorbed moisture content from $5.20 \times 10^{13}$ (atoms/cm$^2$) to $1.05 \times 10^{13}$ (atoms/cm$^2$). After the annealing, the OH groups were $5.15 \times 10^{14}$ (atoms/cm$^2$). The OH groups were reserved with substantially no change.

Consequently, it was confirmed that the moisture content which caused defects such as voids and the OH groups which contributed to the bonding strength could be controlled independently of each other.

Subsequently, the bonded substrate stack was divided using the porous silicon layer to obtain a substrate having an SOI layer on a silicon oxide layer serving as a buried insulating layer. After that, the separation layer remaining on the surface of the SOI layer was removed by etching or the like. After that, the resultant structure was annealed in hydrogen to planarize the surface of the SOI layer.

EXAMPLE 3

Example 3 is also directed to an SOI substrate manufacturing method employing the ELTRAN (registered trademark) method.

First, a porous silicon layer was formed by anodizing on the surface of a silicon substrate serving as a seed substrate. Subsequently, a silicon layer was epitaxially grown on the porous silicon layer by CVD or the like, and a silicon oxide layer (SiO$_2$ layer) was formed on the epitaxially grown silicon layer, thus obtaining the first substrate. As the second substrate (handle substrate), a silicon substrate was prepared.

The first and second substrates were subjected to a bonding surface processing step. After that, the first and second substrates were bonded to obtain a bonded substrate stack. In this case, the bonding surface processing step was performed in the following manner.

First, the first and second substrates were SC-1 cleaned. The final cleaning step of SC-1 cleaning included cleaning with ammonia/hydrogen peroxide and subsequent rinsing with pure water. Because of SC-1 cleaning, the surfaces of the first and second substrates were terminated with sufficient amounts of OH groups. These surfaces had also adsorbed excessive moisture contents as well.

In this state, when the OH group density of the second substrate was measured by APIMS-TDS measurement, it was $6.20 \times 10^{13}$ (atoms/cm$^2$). This value was slightly lower than $1.32 \times 10^{14}$ (atoms/cm$^2$) of Example 1. This is probably because the surface was not subjected to an activating process.

The first and second substrates after the activating process were annealed at 110° C. for 30 sec on the stage of a bonding device and then bonded. This annealing decreased the adsorbed moisture content of the second substrate from $8.20 \times 10^{13}$ (atoms/cm$^2$) to $2.03 \times 10^{13}$ (atoms/cm$^2$). After the annealing, the OH groups of the second substrate were $6.18 \times 10^{13}$ (atoms/cm$^2$). The OH groups were reserved with substantially no change.

Consequently, it was confirmed that the moisture content which caused defects such as voids and the OH groups which contributed to the bonding strength could be controlled independently of each other.

Subsequently, the bonded substrate stack was divided using the porous silicon layer to obtain a substrate having an SOI layer on a silicon oxide layer serving as a buried insulating layer. After that, the separation layer remaining on the surface of the SOI layer was removed by etching or the like. After that, the resultant structure was annealed in hydrogen to planarize the surface of the SOI layer.

EXAMPLE 4

The defects such as voids caused by the excessive moisture contents on the bonding surfaces occur in the peripheral portion of a bonded substrate stack probably because the excessive moisture contents on the bonding surfaces cannot be discharged outside in the bonding step. Therefore, the larger the moisture contents on the bonding surfaces are, the more important it is to sufficiently decrease the speed (bonding speed) with which the bonding portion enlarges, when bonding the two substrates, to discharge that much moisture contents outside entirely.

In Example 1, the bonding speed with which the first and second substrates were bonded without annealing the substrate surfaces which had been subjected to the annealing process was 40 mm/sec, whereas the bonding speed with which the annealed first and second substrates were bonded was 15 mm/sec. The adsorbed moisture content at this time was $3.30 \times 10^{13}$ (atoms/cm$^2$) with "annealing" and $1.12 \times 10^{13}$ (atoms/cm$^2$) without "annealing".

Two substrates having hydrophobic substrates were bonded. When the adsorbed moisture content was $5.20 \times 10^{12}$ (atoms/cm$^2$), the bonding speed was 9 mm/sec.

In Example 2, the bonding speed with which the first and second substrates were bonded without annealing was 50 mm/sec, whereas the bonding speed with annealing was 12 mm/sec.

In Example 3, the bonding speed with which the first and second substrates were bonded without annealing was 35 mm/sec, whereas the bonding speed with annealing was 16 mm/sec.

Therefore, in order not to cause defects such as voids in the peripheral portion of the bonded substrate stack, regarding the bonding speed, it is preferably set to 20 mm/sec or less.

EXAMPLE 5

Example 5 is directed to an SOI substrate manufacturing method employing the Smart Cut method. The SOI substrate manufacturing method according to Example 5 will be described with reference to FIGS. 6A to 6E.

Figure 6A:
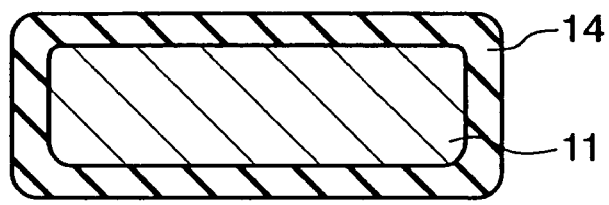
FIGS. 6A to 6E are views showing a method of manufacturing an SOI substrate according to the Smart Cut (registered trademark) method.
Figure 6B:
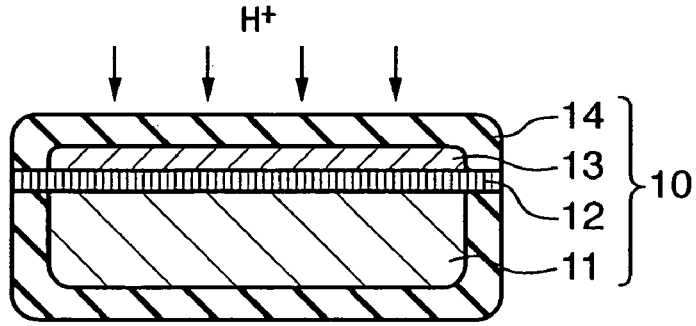

First, in the step shown in FIG. 6A, a silicon substrate 11 called a bond wafer or bond substrate was oxidized to form a silicon oxide (SiO$_2$) layer 14 on its surface. In the step shown in FIG. 6B, hydrogen ions are implanted to a predetermined depth in the silicon substrate 11 through the silicon oxide layer 14 to form a defective layer (ion implanted layer) serving as a separation layer 12. Thus, a first substrate 10 was obtained.

Figure 6C:
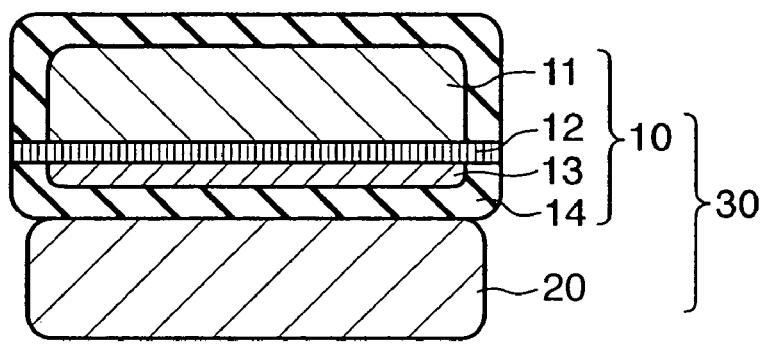

Subsequently, in the step shown in FIG. 6C, the surface (bonding surface) of the first substrate 10 and the surface (bonding surface) of a second substrate (silicon substrate) 20 to serve as a handle substrate were subjected to a bonding surface processing step. After that, the first and second substrates 10 and 20 were bonded to obtain a bonded substrate stack 30. The bonding surface processing step was performed in the following manner.

First, the first and second substrates 10 and 20 were cleaned by repeating ozone cleaning and DHF cleaning using a single-wafer cleaning machine and then rinsed with pure water. In this stage, the second substrate 20 having a silicon surface was hydrophobic.

Subsequently, the surfaces of the first and second substrates 10 and 20 were activated by subjecting them to an H$_2$O plasma process. The H$_2$O plasma process was performed with discharging power of 100 W for 30 sec by a parallel-plate RF plasma processing apparatus while introducing H$_2$O gas at 100 sccm. After the plasma process, the surfaces were rinsed with pure water. Due to the plasma process, the surfaces of the first and second substrates 10 and 20 were terminated with sufficient amounts of OH groups. Meanwhile, excessive moisture contents have been adsorbed by the surfaces of the first and second substrates 10 and 20. In this state, when the OH group density of the second substrate 20 was measured by APIMS-TDS measurement, it was $2.20 \times 10^{14}$ (atoms/cm$^2$).

The first and second substrates 10 and 20 after the activating process were annealed at 150° C. for 30 sec on the stage of a bonding device and then bonded. This annealing decreased the adsorbed moisture content of the second substrate 20 from $5.20 \times 10^{13}$ (atoms/cm$^2$) to $8.03 \times 10^{12}$ (atoms/cm$^2$). After the annealing, the OH groups of the second substrate 20 were $2.15 \times 10^{14}$ (atoms/cm$^2$). The OH groups were reserved with substantially no change.

Consequently, it was confirmed that the moisture content which caused defects such as voids and the OH groups which contributed to the bonding strength could be controlled independently of each other.

Figure 6D:
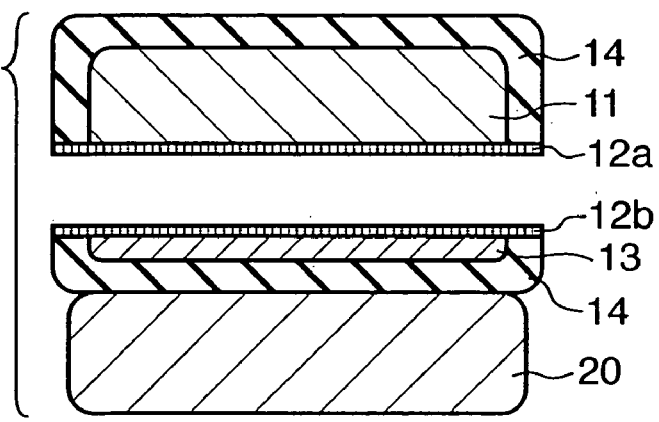

Subsequently, in the step shown in FIG. 6D, the bonded substrate stack 30 was divided using the separation layer 12 to obtain a substrate having an SOI layer 13 on the silicon oxide layer 14 serving as a buried insulating layer.

Figure 6E:
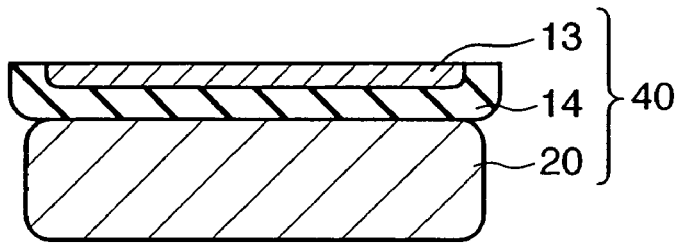

Subsequently, in the step shown in FIG. 6E, an ion damage layer 12b as the remaining separation layer was removed by a polishing process, or by separation by means of sacrificial oxidation and annealing to obtain an SOI substrate 40 having a silicon layer 13 with a desired thickness.

As many apparently widely different embodiments of the present invention can be made without departing from the spirit and scope thereof, it is to be understood that the invention is not limited to the specific embodiments thereof except as defined in the claims.

CLAIMS OR PRIORITY

This application claims priority from Japanese Patent Application No. 2004-262966 filed on Sep. 9, 2004, the entire contents of which are hereby incorporated by reference herein.

What is claimed is:

1. A method of manufacturing a bonded substrate stack comprising:

increasing a concentration of OH groups to $\geq 5 \times 10^{13}$ atoms/cm$^2$ on a surface of a first substrate which contains silicon;

cleaning the surface of the first substrate with pure water;

heating the first substrate to decrease a moisture concentration on the surface of the first substrate to $\leq 5 \times 10^{13}$ atoms/cm$^2$ while maintaining the concentration of OH groups $\geq 5 \times 10^{13}$ atoms/cm$^2$;

joining the surface of the first substrate to a surface of a second substrate which contains silicon; and bonding the surfaces of said substrates;

wherein voids are not present in the bonded substrate stack.

2. The method according to claim 1, wherein the moisture concentration is decreased by heating the first substrate to a temperature falling within a range of 50 to 200° C.

3. The method according to claim 1, wherein the moisture concentration is decreased in one of an air atmosphere, an inert gas atmosphere, or a reduced pressure atmosphere.

4. The method according to claim 1, wherein the concentration of OH groups is increased by cleaning the surface of the first substrate with a cleaning liquid that increases the concentration of OH groups.

5. The method according to claim 1, wherein the concentration of OH groups is increased by activating the surface of the first substrate and thereafter providing water to said surface.

6. The method according to claim 1, wherein bonding is performed such that a bonding portion of the first and second substrates enlarges with a speed of not more than 10 mm/sec.

7. The method according to claim 1, wherein a substrate having a silicon layer and silicon oxide layer sequentially on a separation layer is employed as the first substrate, and a silicon substrate is employed as the second substrate.

8. The method according to claim 1, wherein a substrate having a silicon layer and silicon oxide layer sequentially on a separation layer is employed as the first substrate, and a substrate having a silicon oxide layer on a surface thereof is employed as the second substrate.

9. The method according to claim 1, wherein a substrate having a silicon layer on a surface thereof and a separation layer thereunder is employed as the first substrate, and a substrate having a silicon oxide layer on a surface thereof is employed as the second substrate.

10. The method according to claim 2, wherein the moisture concentration is decreased by heating the first substrate to a temperature falling within a range of 60 to 175° C.

11. The method according to claim 5, wherein the concentration of OH groups is increased by irradiating the surface of the first substrate with light or a plasma to activate said surface.

12. The method according to claim 7, 8, or 9, further comprising dividing the bonded substrate stack by using the separation layer.

* * * * *